United States Patent
Chen

(10) Patent No.: US 10,121,826 B1
(45) Date of Patent: Nov. 6, 2018

(54) SEMICONDUCTOR DEVICE AND METHOD OF FABRICATING THE SAME

(71) Applicant: Winbond Electronics Corp., Taichung (TW)

(72) Inventor: Frederick Chen, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/499,904

(22) Filed: Apr. 28, 2017

(51) Int. Cl.
- H01L 29/06 (2006.01)
- H01L 27/24 (2006.01)
- H01L 45/00 (2006.01)
- H01L 29/78 (2006.01)
- H01L 29/423 (2006.01)
- H01L 27/22 (2006.01)
- H01L 43/02 (2006.01)
- G11C 11/16 (2006.01)
- H01L 43/08 (2006.01)
- H01L 23/528 (2006.01)
- H01L 43/12 (2006.01)

(52) U.S. Cl.
CPC ........ *H01L 27/2436* (2013.01); *G11C 11/161* (2013.01); *H01L 23/528* (2013.01); *H01L 27/228* (2013.01); *H01L 29/0649* (2013.01); *H01L 29/0673* (2013.01); *H01L 29/42392* (2013.01); *H01L 29/7851* (2013.01); *H01L 43/02* (2013.01); *H01L 43/08* (2013.01); *H01L 43/12* (2013.01); *H01L 45/00* (2013.01); *H01L 45/08* (2013.01); *H01L 45/1233* (2013.01); *H01L 45/16* (2013.01)

(58) Field of Classification Search
None
See application file for complete search history.

(56) References Cited

U.S. PATENT DOCUMENTS

| 7,414,879 | B2* | 8/2008 | Asao | G11C 11/16 365/158 |
| 7,443,718 | B2 | 10/2008 | Ito et al. | |
| 7,830,693 | B2* | 11/2010 | Liu | G11C 13/0007 365/148 |
| 8,363,442 | B2* | 1/2013 | Liu | G11C 13/0007 365/148 |
| 2016/0099211 | A1* | 4/2016 | Baek | H01L 27/088 257/774 |
| 2016/0276484 | A1* | 9/2016 | Kim | H01L 29/7851 |
| 2016/0380052 | A1* | 12/2016 | Kim | H01L 29/0653 257/401 |

FOREIGN PATENT DOCUMENTS

| TW | 200633145 | 9/2006 |
| WO | 2015147882 | 10/2015 |

OTHER PUBLICATIONS

"Office Action of Taiwan Counterpart Application", dated May 10, 2018, p. 1-p. 3.

* cited by examiner

*Primary Examiner* — Ali Naraghi
(74) *Attorney, Agent, or Firm* — JCIPRNET

(57) ABSTRACT

Provided are a semiconductor device including a plurality of transistors and a plurality of memory cells. Each of the transistors includes a gate structure and a source/drain region. The memory cells are respectively located over the gate structures. A lower electrode of each of the memory cells and an upper electrode of an adjacent memory cell are electrically connected to the source/drain region between corresponding two transistors.

20 Claims, 11 Drawing Sheets

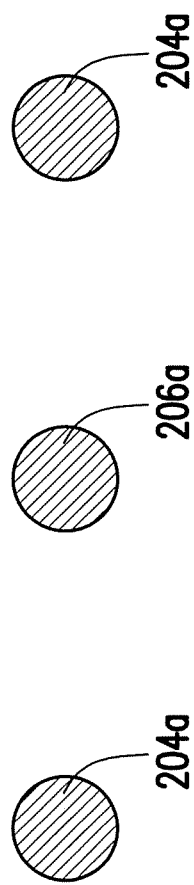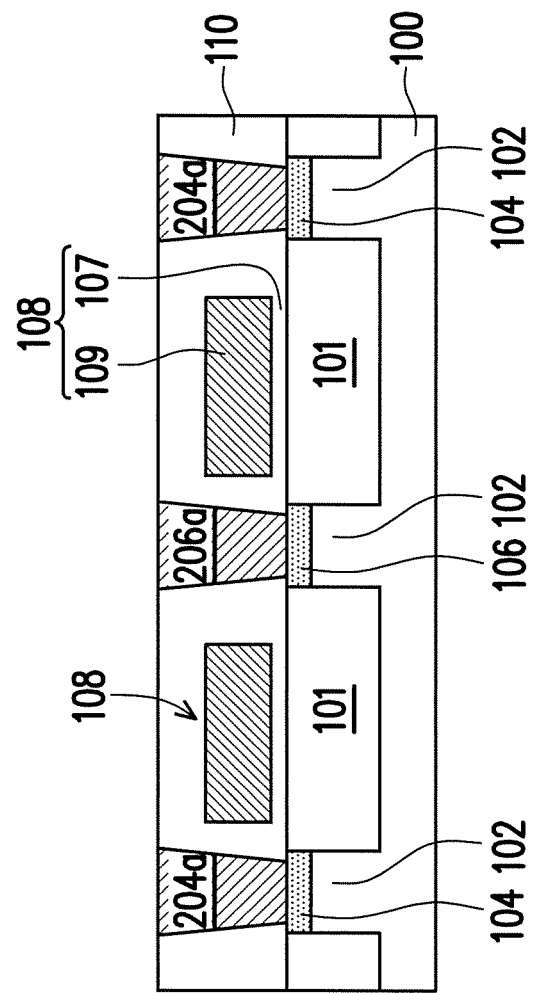
FIG. 4A
FIG. 4B

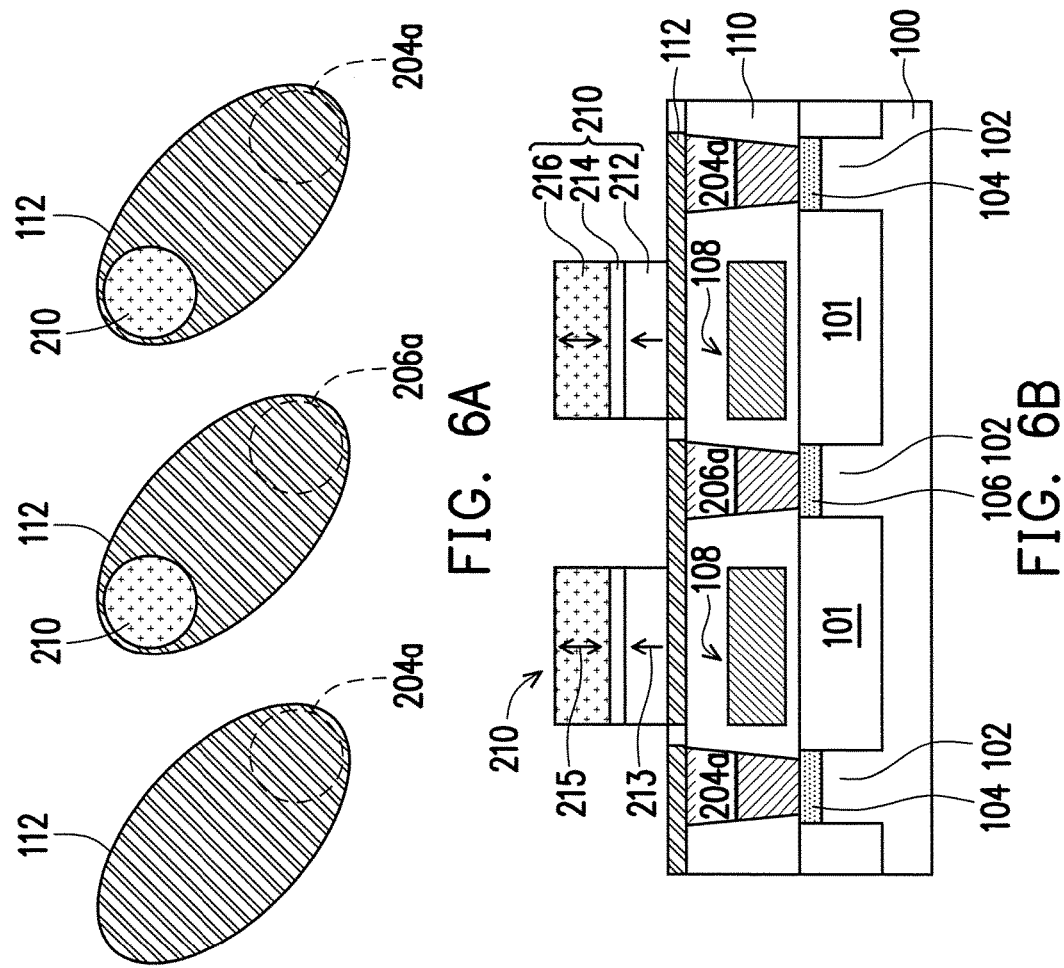

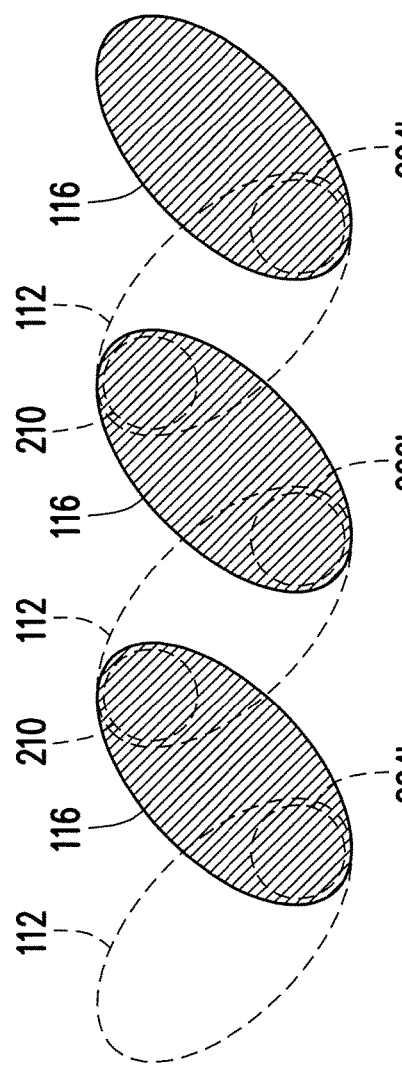
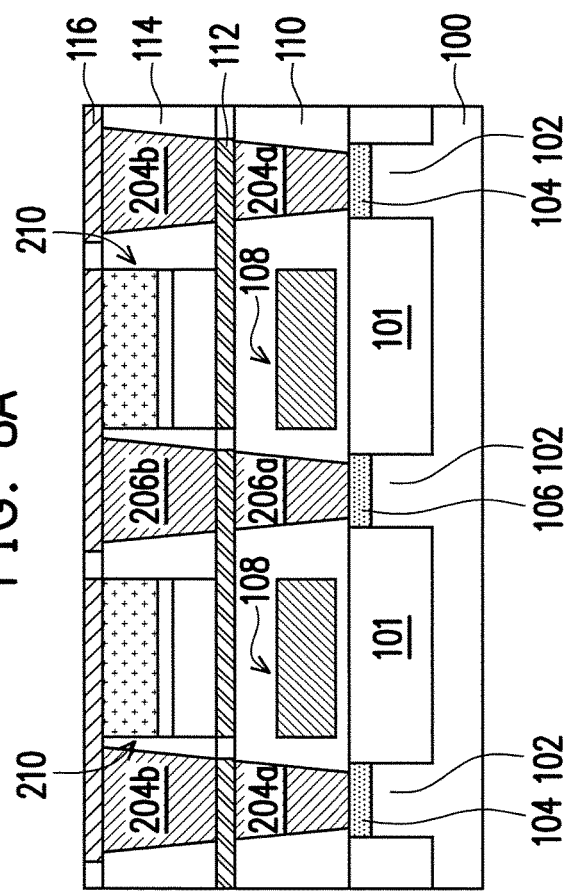
FIG. 8A
FIG. 8B

SEMICONDUCTOR DEVICE AND METHOD OF FABRICATING THE SAME

BACKGROUND OF THE INVENTION

Field of the Invention

The invention relates to an integrated circuit and a method of fabricating the same; more particularly, the invention relates to a semiconductor and a method of fabricating the same.

Description of Related Art

Magnetic random access memory (MRAM) has advantages of fast speed, low power consumption, high density, non-volatile, and has almost unlimited read and write times, and is predicted as a mainstream of memories coming in the next generation. A basic structure of MRAM is formed by a pinned layer, a barrier layer and a free layer. By changing a magnetization direction of the free layer to be parallel or antiparallel to a magnetization direction of the pinned layer, a magnetoresistance thereof respectively has a low resistance state and a high resistance state for storing information.

A spin transfer torque (STT) MRAM is regarded as a memory of the new generation, which records digital information of 0 and 1 through spin transfer switching. Specifically, the STT mechanism, by which an angular momentum conservation mechanism of spin-polarized electrons and a local magnetic moment is used to switch the magnetization direction of the free layer of the device, so as to implement the write operation. A STT write current is proportional to a device size, which avails miniaturization. Takes the STT-MRAM as a main magnetic memory cell structure, which has better endurance, reliability, and an operating current thereof is smaller compared with that of the other type of the memory, such as SRAM, DRAM, or RRAM. Therefore, STT-MRAM is better suited for embedded working memory.

SUMMARY

The invention provides a semiconductor device combining FinFETs and memory cells, for example MRAMs or RRAM, to increase transistor density and effective width while reduce cell size.

The invention provides a semiconductor device having memory cells over word lines respectively to achieve $4F^2$ cell size.

In an embodiment of the invention, a semiconductor device includes a plurality of transistors and a plurality of memory cells. Each of the transistors includes a gate structure and a source/drain region. The memory cells are respectively located on the gate structures. A lower electrode of each of the memory cells and an upper electrode of an adjacent memory cell are electrically connected to the source/drain region between corresponding two transistors.

According to an embodiment of the invention, the source/drain region between corresponding two transistors is a source of one of the corresponding two transistors and a drain of the other of the corresponding two transistors.

According to an embodiment of the invention, the transistors include fin-type field effect transistors (FinFETs) or gate-all-around FETs (GAA-FETs).

According to an embodiment of the invention, the memory cells include magnetic random access memories (MRAMs), resistive random access memories (RRAMs), or a combination thereof.

According to an embodiment of the invention, when the memory cells are MRAMs, each of the MRAMs comprises a pinned layer, a free layer and a barrier layer therebetween. The pinned layer is connected to a corresponding lower electrode. The free layer is connected to a corresponding upper electrode.

According to an embodiment of the invention, the memory cells are RRAMs, each of the RRAMs includes a variable resistance layer between a corresponding lower electrode and a corresponding upper electrode.

According to an embodiment of the invention, the semiconductor device further includes a bit line and a source line. The bit line is coupled to one of the transistors and corresponding one of the memory cells. The source line is coupled to another of the transistors and corresponding another of the memory cells. An extending direction of the bit line differs from an extending direction of the source line.

According to an embodiment of the invention, the upper electrode of each of the memory cells is electrically connected to the lower electrode of an adjacent memory cell by a plug, except for the memory cell whose upper electrode is connected to an overlying bit line.

In an embodiment of the invention, a semiconductor device includes a substrate, a plurality of semiconductor layers, a plurality of isolation structures, a plurality of gate structures, and a plurality of memory cells. The semiconductor layers are located on the substrate. The isolation structures are located on the substrate to isolate the semiconductor layers. The semiconductor layers protrude from the isolation structures. The gate structures are respectively across at least portions of the semiconductor layers and portions of the isolation structures. The memory cells are respectively located on the gate structures between adjacent two semiconductor layers. Each of the memory cells includes a lower electrode and an upper electrode, the lower electrode of each of the memory cells is electrically connected to an upper electrode of an adjacent memory cell.

According to an embodiment of the invention, the lower electrode of each of the memory cells and the upper electrode of the adjacent memory cell are electrically connected to one semiconductor layer.

According to an embodiment of the invention, the memory cells include MRAMs, RRAMs, or a combination thereof.

According to an embodiment of the invention, when the memory cells are MRAMs, each of the MRAMs includes a pinned layer, a free layer and a barrier layer therebetween. The pinned layer is connected to a corresponding lower electrode. The free layer is connected to a corresponding upper electrode.

According to an embodiment of the invention, when the memory cells are RRAMs, each of the RRAMs includes a variable resistance layer between a corresponding lower electrode and a corresponding upper electrode.

According to an embodiment of the invention, the semiconductor device further includes a bit line and a source line. The bit line is coupled to one of the memory cells and corresponding one of the semiconductor layers. The source line is coupled to another of the memory cells and corresponding another of the semiconductor layers. An extending direction of the bit line differs from an extending direction of the source line.

According to an embodiment of the invention, the semiconductor layers include semiconductor fins extending along a first direction and the semiconductor fins and the isolation structures are arranged alternately along a second direction.

According to an embodiment of the invention, the semiconductor layers include nanowire stacks extending along a first direction and the nanowire stacks and the isolation structures are arranged alternately along a second direction.

According to an embodiment of the invention, the nanowire stacks are encapsulated by the gate structures extending along the second direction.

According to an embodiment of the invention, each of the nanowire stacks includes a plurality of nanowires stacked along a vertical direction perpendicular to a top surface of the substrate.

According to an embodiment of the invention, a linewidth of each of the nanowires is in a range of 5 nm to 50 nm.

According to an embodiment of the invention, a pitch of adjacent two nanowires in the vertical direction is in a range of 5 nm to 20 nm.

According to an embodiment of the invention, the nanowires comprise silicon.

In view of the above, the semiconductor device of the invention combines FinFETs and memory cells, such as MRAMs or RRAMs. Specifically, the memory cells are respectively located on the gate structures, such as word lines. A lower electrode of each of the memory cells and an upper electrode of an adjacent memory cell are electrically connected to the source/drain region between corresponding two transistors. In the case, the cell size of the invention will decrease to $4F^2$ cell size, while the better endurance, reliability, and a smaller operating current are achieved compared with conventional memory.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4A to FIG. 8A are schematic top views illustrating a process of fabricating a semiconductor device in accordance with a second embodiment of the invention.

FIG. 4B to FIG. 8B are schematic cross-sectional views respectively in FIG. 4A to FIG. 8A.

DETAILED DESCRIPTION OF DISCLOSED EMBODIMENTS

Figure 1:
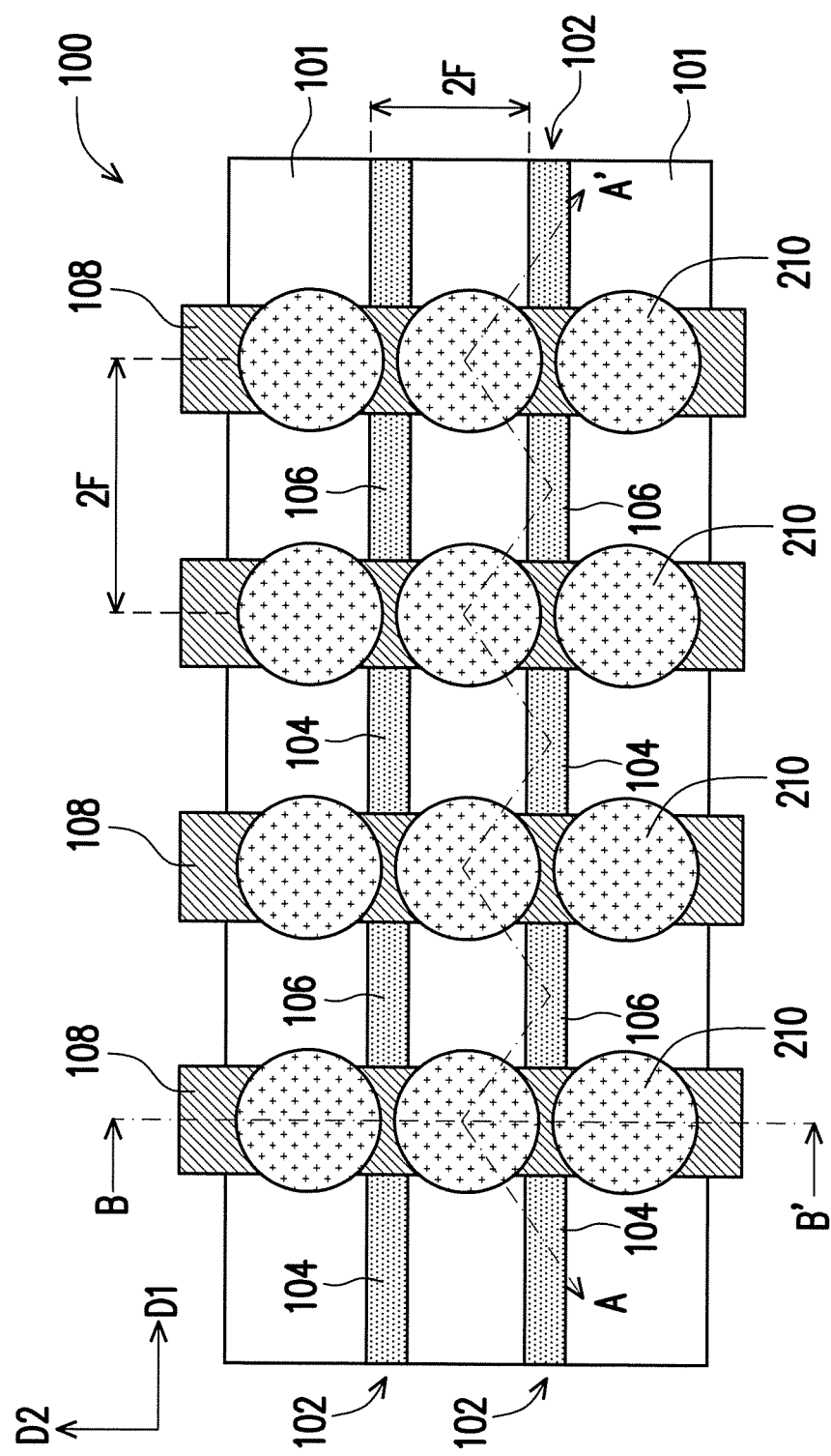
FIG. 1 is a schematic top view of a semiconductor device in accordance with a first embodiment of the invention.

The invention will now be described with reference to the accompanying drawings, in which exemplary embodiments of the invention are shown. Note that the invention can be accomplished in many different ways and should not be limited to the embodiments set forth herein. The thickness of layers and regions shown in the drawings may be enlarged for clear illustration. Identical or similar reference numbers represent the identical or similar devices, and thus these identical or similar devices will not be elaborated in each paragraph below.

Figure 2A:
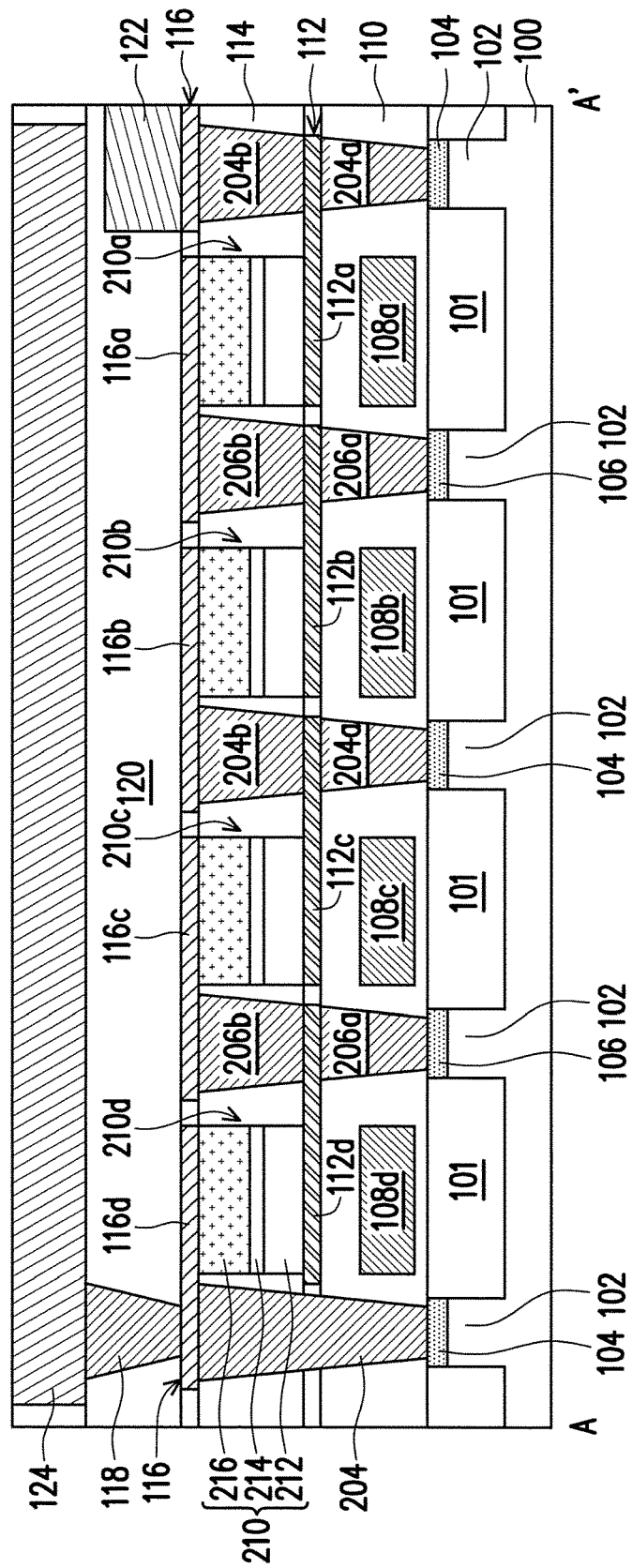
FIG. 2A and FIG. 2B are schematic cross-sectional views respectively along line A-A' and line B-B' in FIG. 1.
Figure 2B:
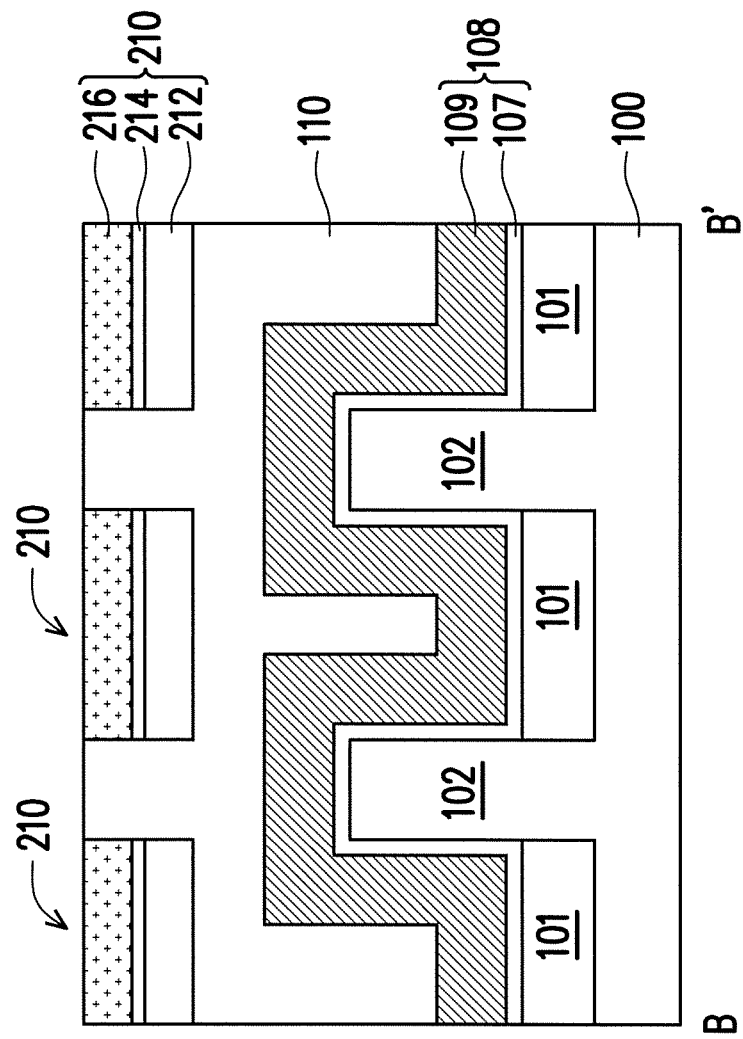

FIG. 1 is a schematic top view of a semiconductor device in accordance with a first embodiment of the invention. FIG. 2A and FIG. 2B are schematic cross-sectional views respectively along line A-A' and line B-B' in FIG. 1.

With reference to FIG. 1, the semiconductor device of the first embodiment includes a substrate 100, a plurality of isolation structures 101, a plurality of gate structures 108, source/drain (S/D) regions 104 and 106, and a plurality of memory cells 210. The substrate 100 has a plurality of semiconductor fins 102. The semiconductor fins 102 is extended along a first direction D1 and arranged along a second direction D2. The isolation structures 101 are located on the substrate 100 to isolate the semiconductor fins 102. That is, the isolation structures 101 and the semiconductor fins 102 are alternately arranged along the second direction D2. As shown in FIG. 2B, the semiconductor fins 102 protrude from the isolation structures 101. The gate structures 108 are conformally formed and respectively across and portions of the semiconductor fins 102 and portions of the isolation structures 101. As shown in FIGS. 1 and 2A, the source/drain (S/D) regions 104 and 106 are formed on the semiconductor fins 102 at two sides of the gate structures 108. In other words, the source/drain (S/D) regions 104 and 106 are formed on portions of the semiconductor fins 102 which are not covered by the gate structures 108. The other portions of the semiconductor fins 102 which are covered by the gate structures 108 are referred as channel regions.

The memory cells 210 are respectively located on the gate structures 108 between adjacent two semiconductor fins 102. In the arrangement, the semiconductor device of the first embodiment is able to achieve $4F^2$ cell size. In some embodiments, the memory cells 210 include MRAMs, RRAMs, or a combination thereof. When the memory cells 210 are MRAMs, as shown in FIG. 2A and FIG. 2B, each of the MRAMs 210 includes a pinned layer 212, a free layer 216 and a barrier layer 214 therebetween. In alternative embodiments, the memory cells 210 may be RRAMs, each of RRAMs includes a variable resistance layer (not shown) between a corresponding lower electrode and a corresponding upper electrode. In an embodiment, the memory cells 210 may be arranged in an array, for example. Besides, the memory cells 210 in FIG. 1 are arranged in a 3×4 array; however, the invention is not limited thereto. In other embodiments, the number of the memory cells 210 may be determined according to actual needs.

With reference to FIGS. 1 and 2A, the semiconductor device of the first embodiment further includes lower electrodes 112, upper electrodes 116, and plugs 204, 204a, 204b, 206a, and 206b. The pinned layer 212 of each of the MRAMs 210 is connected to a corresponding lower electrode 112. The free layer 216 of each of the MRAMs 210 is connected to a corresponding upper electrode 116. The corresponding lower electrode 112 of each of the MRAMs 210 is electrically connected to an upper electrode 116 of an adjacent MRAM 210. MRAMs 210c and 210d is taken for example, the pinned layer 212 of the MRAM 210d is connected to the lower electrode 112d. The free layer 216 of the MRAM 210d is connected to the upper electrode 116d. The lower electrode 112d is electrically connected to the upper electrode 116c of the adjacent MRAM 210c by the plug 206b. The lower electrode 112d of the MRAM 210d and the upper electrode 116c of the adjacent MRAM 210c are electrically connected to the S/D region 106 between the gate structures 108c and 108d by the plug 206a and 206b. In an embodiment, the S/D region 106 between the gate structures 108c and 108d may be a source of one transistor including gate structure 108d, while may be a drain of another transistor including gate structure 108c. Similarly, the lower electrode 112c of the MRAM 210c and the upper electrode 116b of the adjacent MRAM 210b are electrically connected to the S/D region 104 between the gate structures 108c and 108b by the plug 204a and 204b. In an embodiment, the S/D region 104 between the gate structures 108c and 108b may be a source of one transistor including gate structure 108c, while may be a drain of another transistor including gate structure 108b. Since the arrangement of MRAMs 210a and 210b is similar to the arrangement of MRAMs 210c and 210d, no further explanation is provided below. It should be noted that the upper electrode of each of the memory cells is electrically connected to the lower electrode of an adjacent memory cell by a plug, except for the memory cell whose upper electrode is connected to an overlying bit line. As shown in FIG. 2A, the upper electrode 116d is connected to an overlying bit line 124 and not connected to any lower electrode.

In some embodiments, the lower electrodes 112, the upper electrodes 116, and plugs 204, 204a, 204b, 206a, and 206b are referred as an interconnection in dielectric layers 110 and 114. The arrangement of the interconnection in FIG. 2A may be adjusted according to actual needs. For example, the plugs 206a and 206b (or the plugs 204a and 204b)can become one plug passing through the corresponding lower electrode 112. Alternatively, one or more dielectric layers and interconnections may exist within the dielectric layers 110 and 114.

In addition, the semiconductor device of the first embodiment further includes a source line 122 and a bit line 124. The source line 122 is coupled to the MRAM 210a and the transistor including the gate structure 108a. In detail, the source line 122 is electrically connected to the MRAM 210a by the plug 204b and the lower electrode 112a. The source line 122 is electrically connected to the S/D region 104 of the transistor including the gate structure 108a by the plugs 204a and 204b, and the lower electrode 112a. The bit line 124 is coupled to MRAM 210d and the transistor including the gate structure 108d. Specifically, the bit line 124 is electrically connected to the MRAM 210d by a plug 118 in a dielectric layer 120 and the upper electrodes 116d. The bit line 124 is electrically connected to the S/D region 104 of the transistor including the gate structure 108d by the plug 118, the upper electrodes 116d, and the plug 204. It should be noted that an extending direction of the bit line 124 differs from an extending direction of the source line 122. In some embodiments, the extending direction of the bit line 124 and the extending direction of the source line 122 are substantially perpendicular to each other. In some embodiments, the bit line 124 and the source line 122 are located at different level. For example, as shown in FIG. 2A, the bit line 124 is located above the source line 122. In alternative embodiment, the bit line 124 may be located below the source line 122.

Figure 2C:
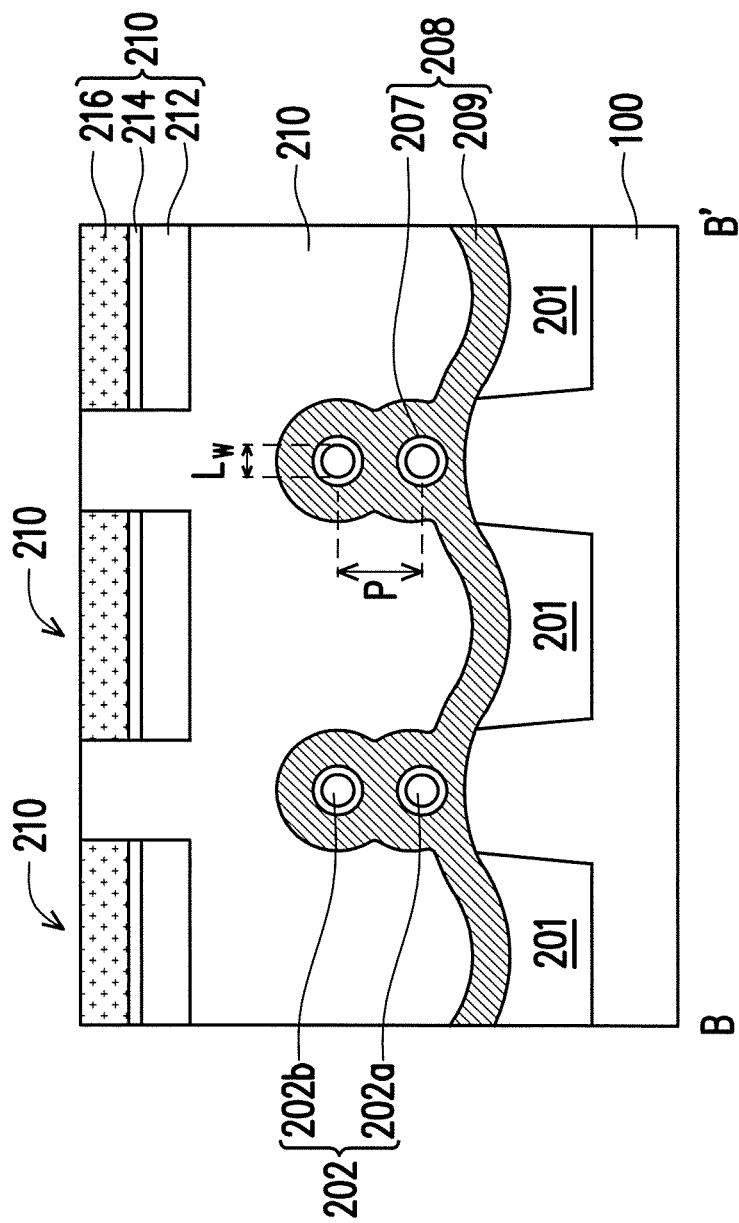
FIG. 2C is schematic cross-sectional views along B-B' in FIG. 1 in accordance with an another embodiment of the invention.

Although the portions of the structures described herein take the form of a fin, it will be understood that another configuration, such as a "gate-all-around" structure (e.g. a nanowire stack structure) is also applied on the semiconductor device of the invention. FIG. 2C is schematic cross-sectional views along B-B' in FIG. 1 in accordance with an another embodiment of the invention.

With reference to FIG. 2C, a structure of FIG. 2C is similar to a structure of FIG. 2B. The difference between the two is that the semiconductor fins 102 of FIG. 2B are replaced by nanowire stacks 202. As shown in FIG. 2C, each of the nanowire stacks 202 includes two nanowires 202a and 202b. The nanowires 202a and 202b are stacked along a direction perpendicular to a top surface of the substrate 100. The nanowire stacks 202 are encapsulated by the gate structures 208. Specifically, the each of the gate structures 208 includes a gate dielectric layer 207 and a gate electrode 209. The gate dielectric layer 207 completely cover the surface of the nanowires 202a and 202b, so as to electrically isolate the nanowires 202a and 202b from the gate electrode 209. Although only two nanowires 202a and 202b are depicted in FIG. 2C, the invention is not limited thereto. In other embodiments, the numbers of the nanowires may be adjusted according to the needs.

Since the material and forming method of the isolation structures 201, the gate dielectric layer 207, and the gate electrode 209 are similar to the material and forming method of the isolation structures 101, the gate dielectric layer 107, and the gate electrode 109, no further explanation is provided below. In some embodiments, a linewidth $L_w$ of each of the nanowires 202a and 202b is in a range of 5 nm to 50 nm. a pitch P of adjacent two nanowires 202a and 202b is in a range of 5 nm to 20 nm. The nanowires 202a and 202b include silicon.

Figure 3:
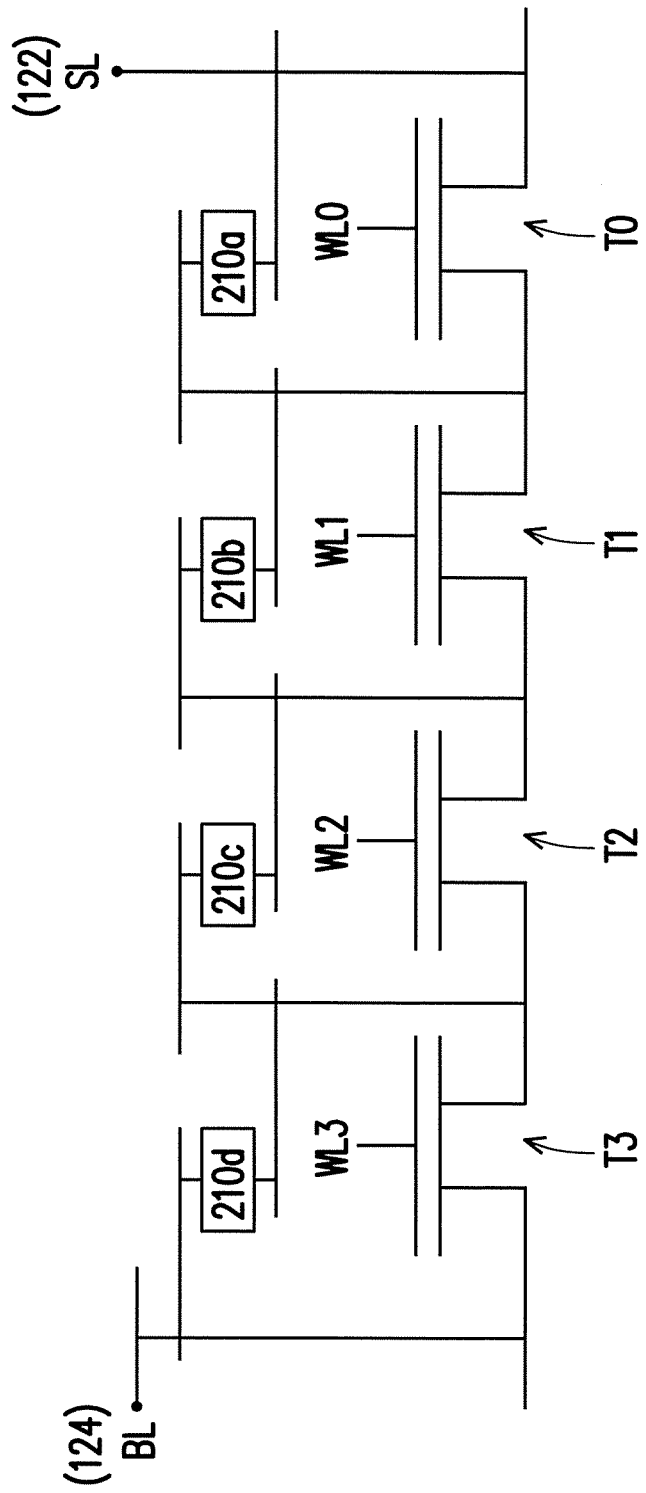
FIG. 3 is a schematic circuit of the semiconductor device of the first embodiment of the invention.

FIG. 3 is a schematic circuit of the semiconductor device of the first embodiment of the invention.

With reference to FIG. 3, the semiconductor device of the first embodiment includes the transistors T0, T1, T2, and T3, the memory cells 210a, 210b, 210c, and 210d, the bit line BL (corresponding to the bit line 124 in FIG.2A), and the source line SL (corresponding to the source line 122 in FIG.2A). The transistors T0, T1, T2, and T3 respectively include word lines WL0, WL1, WL2, and WL3. The bit line BL and the source line SL are disposed at two side of a group of the transistors T0, T1, T2, and T3. That is, the transistors T0, T1, T2, and T3 and the memory cells 210a, 210b, 210c, and 210d are sandwiched by the bit line BL and the source line SL. In detail, a lower electrode of the memory cell 210a is coupled to the source line SL and a source of the transistor T0. An upper electrode of the memory cell 210a and a lower electrode of the memory cell 210b are coupled to a drain of the transistor T0 and a source of the transistor T1. The drain of the transistor T0 is coupled to the source of the transistor T1. Similarly, an upper electrode of the memory cell 210b and a lower electrode of the memory cell 210c are coupled to a drain of the transistor T1 and a source of the transistor T2. The drain of the transistor T1 is coupled to the source of the transistor T2. Since the arrangement of the memory cells 210c and 210d is similar to the arrangement of the memory cells 210a and 210b, no further explanation is provided below. Moreover, an upper electrode of the memory cell 210d and the bit line BL are coupled to a drain of the transistor T3. That is, the transistors T0, T1, T2, and T3 are connected in series. The memory cells 210a, 210b, 210c, and 210d are connected in series. A group of the transistors T0, T1, T2, and T3 and a group of the memory cells 210a, 210b, 210c, and 210d are connected in parallel.

The operation of the semiconductor device having the memory cells is illustrated by using the schematic circuit in FIG. 3. The writing operation is taken for example, a writing voltage (e.g., 1 V-2 V) is applied on the bit line BL, while a source voltage (e.g., 0V) is applied on the source line SL. When the memory cell 210a is selected, the transistor T0 corresponding to the memory cell 210a is turn-off, i.e., a gate voltage applied on the word line WL0 is zero. At the same time, the other transistors T1, T2, and T3 are turn-on, i.e., the gate voltages respectively applied on the word lines WL1, WL2, and WL3 are more than the writing voltage. That is, current from the bit line BL flows through the transistors T1, T2, and T3 without flowing the memory cells 210b, 210c, and 210d. At meantime, the current only flow through the selected memory cell 210a, such that the magnetization direction of the selected memory cell 210a is changed. Therefore, the digital information is able to be writing in the selected memory cell 210a.

FIG. 4A to FIG. 8A are schematic top views illustrating a process of fabricating a semiconductor device in accordance with a second embodiment of the invention. FIG. 4B to FIG. 8B are schematic cross-sectional views respectively in FIG. 4A to FIG. 8A.

With reference to FIGS. 4A and 4B, a substrate 100 is provided. The substrate 100 includes a bulk substrate, a silicon-on-insulator (SOI) substrate or a germanium on-insulator (GOI) substrate, for example.

By using a patterned photoresist layer (not shown) as a mask, portions of the substrate 100 are exposed and etched to form a plurality of trenches (not shown) and a plurality of semiconductor fins 102. The trenches are filled up with a plurality of isolation structures 101. In some embodiments, the isolation structures 101 may include silicon oxide, silicon nitride, silicon oxynitride, a spin-on dielectric material, or a low-K dielectric material.

A plurality of gate structures 108 are then conformally formed and respectively across portions of the semiconductor fins 102 and portions of the isolation structures 101. In some embodiments, each of the gate structures 108 includes a gate dielectric layer 107 and a gate electrode 109 located over the gate dielectric layer 107. In some embodiments, the gate dielectric layer 107 includes silicon oxide, silicon nitride, silicon oxy-nitride, high-k dielectric materials, or a combination thereof. The high-k dielectric materials are generally dielectric materials with a dielectric constant greater than 4. The high-k dielectric materials include metal oxide. In some embodiments, examples of the metal oxide used as the high-k dielectric materials include oxides of Li, Be, Mg, Ca,Sr, Sc, Y, Zr, Hf, Al, La, Ce, Pr, Nd, Sm, Eu, Gd, Tb, Dy, Ho, Er, Tm, Yb, Lu, or a combination thereof. The gate dielectric layer 107 is formed by performing a thermal oxidation process, a CVD process, an ALD process, or a combination thereof.

In some embodiments, the gate electrode 109 may be a dummy gate. The dummy gate includes a polysilicon layer, an amorphous silicon layer or a combination thereof formed by performing a CVD process, for example. A metal gate (or called "replacement gate") may replace the dummy gate electrode in subsequent steps. The replacing step is performed by using the conventional replacement gate step; thus no further explanation is provided below.

In alternative embodiments, the gate electrode 109 may be a metal gate, and the gate electrode 109 includes a barrier, a work function layer, a seed layer, an adhesion layer, a barrier layer, or a combination thereof. The metal gate includes Al, Cu, W, Ti, Ta, Ag, Ru, Mn, Zr, TiAl, TiN, TaN, WN, TiAlN, TaN, TaC, TaCN, TaSiN, NiSi, CoSi, or a combination thereof, for example. In some embodiments, the gate electrode 109 includes metals suitable for a PMOS device, such as TiN, WN, TaN, or Ru. In some alternative embodiments, the gate electrode 109 includes metals suitable for an NMOS device, such as Ti, Ag, Al, TiAl, TiAlN, TaC, TaCN, TaSiN, Mn, or Zr. The gate electrode 109 may be formed by performing a suitable process such as ALD, CVD, PVD, plating, or a combination thereof.

A plurality of source/drain (S/D) regions 104 and 106 are formed on portions of the semiconductor fins 102 which are not covered by the gate structures 108. In some embodiments, the S/D regions 104 and 106 are doped through ion implantation. Alternatively, part of the substrate 100 is removed through etching or other suitable processes and the epitaxial layers formed in the hollowed area through epitaxy growth. Specifically, the include SiGe, SiC, or other suitable materials. Top surfaces of the S/D regions 104 and 106 illustrated in FIG. 4B and top surfaces of the isolation structures 101 are coplanar; however, the invention is not limited thereto. In other embodiments, the top surfaces of the S/D regions 104 and 106 may be higher than the top surfaces of the isolation structures 101.

Noted that one of the gate structures 108 and the S/D regions 104 and 106 at two sides of the one of the gate structures 108 are referred as a transistor. The transistors illustrated in FIG. 4B are FinFETs; however, the invention is not limited thereto. In other embodiments, the transistors herein may be planar transistors.

A dielectric layer 110 is then formed over the substrate 100. The dielectric layer 110 covers the isolation structures 101, the S/D regions 104 and 106, and the gate structures 108. The dielectric layer 110 includes a dielectric material. The dielectric material includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof.

Plugs 204a and 206a are formed in a dielectric layer 110. The plugs 204a and 206a are respectively corresponding to the S/D regions 104 and 106. Specifically, the plugs 204a and 206a may be formed by firstly forming via openings (not shown) in the dielectric layer 110, for instance. The via openings are filled with conductive material, such as tungsten(W), aluminum (Al), copper (Cu) or an alloy thereof, for instance. The conductive material is then partially removed to expose a top surface of the dielectric layer 110 by using a planarization process. In some embodiments, the planarization process may include a chemical mechanical polishing (CMP) process, an etching process, or other suitable process. In some embodiments, after planarization process are performed, the top surface of the dielectric layer 110 are substantially coplanar with top surfaces of the plugs 204a and 206a.

Figure 5A:
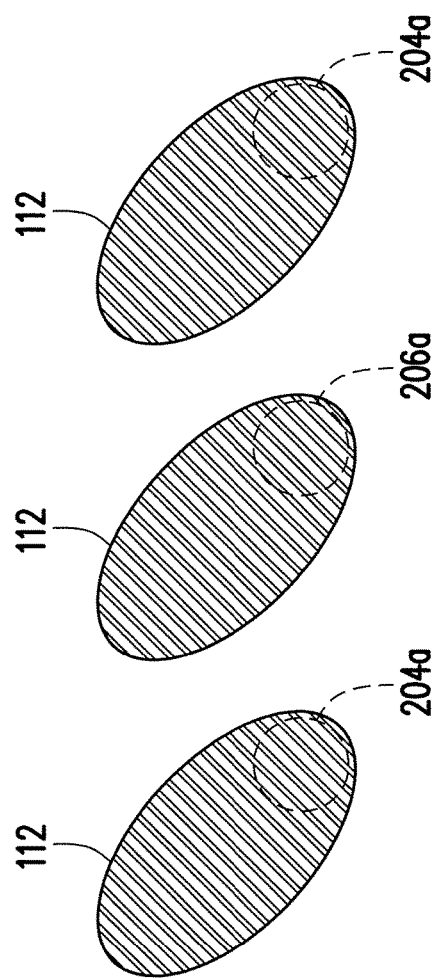
Figure 5B:
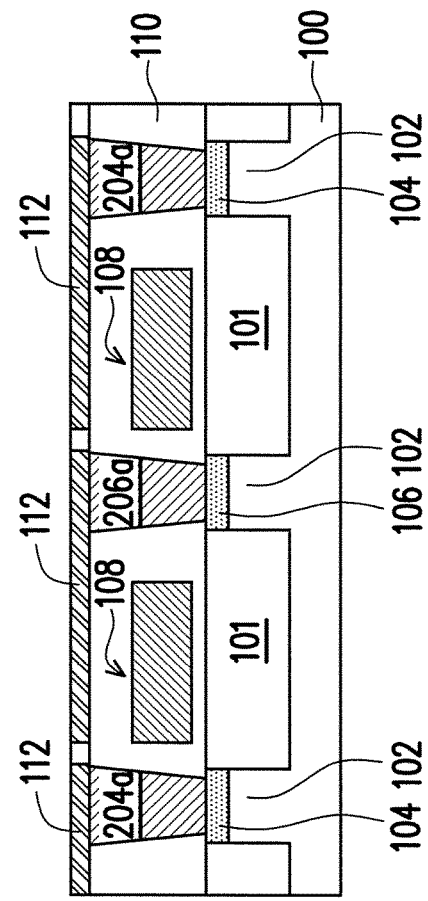

With reference to FIGS. 5A and 5B, a plurality of metal layers 112 are formed on the dielectric layer 110 through chemical vapor deposition (CVD), physical vapor deposition (PVD) or other suitable deposition, for instance. In the embodiment, the metal layers 112 are respectively cover the top surface of the plugs 204a and 206a. Noted that the metal layers 112 hereinafter are referred as lower electrodes 112.

With reference to FIGS. 6A and 6B, a plurality of memory cells 210 are then formed on the lower electrodes 112. The memory cells 210 are respectively located on the gate structures 108 between adjacent two semiconductor fins 102. Namely, the memory cells 210 are respectively corresponding to the gate structures 108. In some embodiments, the memory cells 210 include MRAMs, RRAMs, or a combination thereof. When the memory cells 210 are MRAMs, as shown in FIG. 6B, each of the MRAMs 210 includes a pinned layer 212, a free layer 216 and a barrier layer 214 therebetween.

Specifically, the pinned layer 212 having a fixed magnetization direction 213, which is not varied along with an external magnetic field, and the fixed magnetization direction 213 is used as a reference. The free layer 216 has a magnetization direction 215 capable of being switched. The magnetization direction 215 of the free layer 216 can be freely changed to be parallel or antiparallel to the magnetization direction 213 by applying the external magnetic field or current. By measuring a magnetoresistance difference generated due to parallel and antiparallel of the magnetization directions between the free layer 216 and the pinned layer 212, bit data stored in the free layer 216 can be determined.

In some embodiments, the pinned layer 212 may include ferromagnetic materials of ferrous (Fe), cobalt (Co), nickel (Ni), gadlinium (Gd), terbium (Tb), dysprosium (Dy), boron (B) or an alloy of the above elements, such as CoFeB, NF, FeB, etc. A thickness of the pinned layer 212 may be in a range of 1 nm to 2 nm. The barrier layer 214 may be insulating material having a magnetic tunnel condition under a specified thickness. In some embodiments, the insulating material may be magnesium oxide, aluminium oxide, magnesium, or a combination thereof. A thickness of the barrier layer 214 may be equal to or less than 1 nm. The free layer 216 may be ferromagnetic material with perpendicular anisotropy. The free layer 216 mainly implements the data read/write operation through switching of the magnetic moment in the magnetic film layer, so that the ferromagnetic material of the free layer 216 may be Fe, Co, Ni, Gd, Tb, Dy, B or an alloy of the above elements, such as CoFeB, NF, FeB, etc. A thickness of the free layer 216 may be in a range of 1 nm to 2 nm.

Figure 7A:
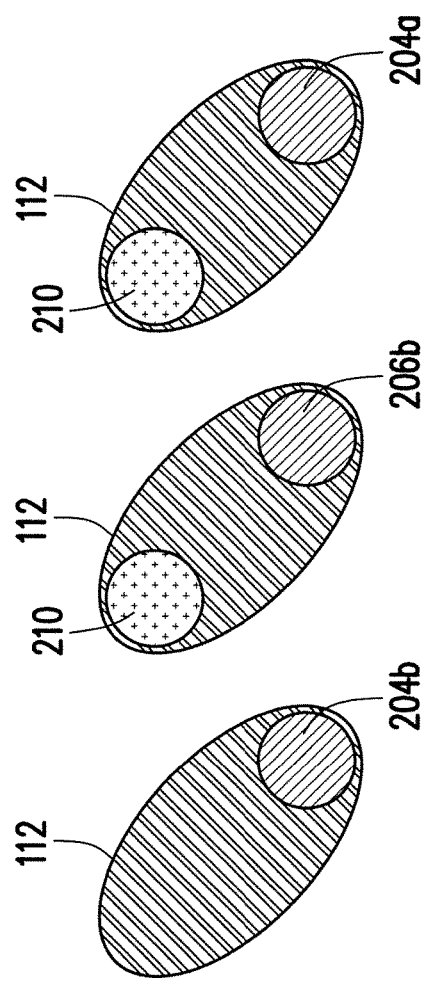
Figure 7B:
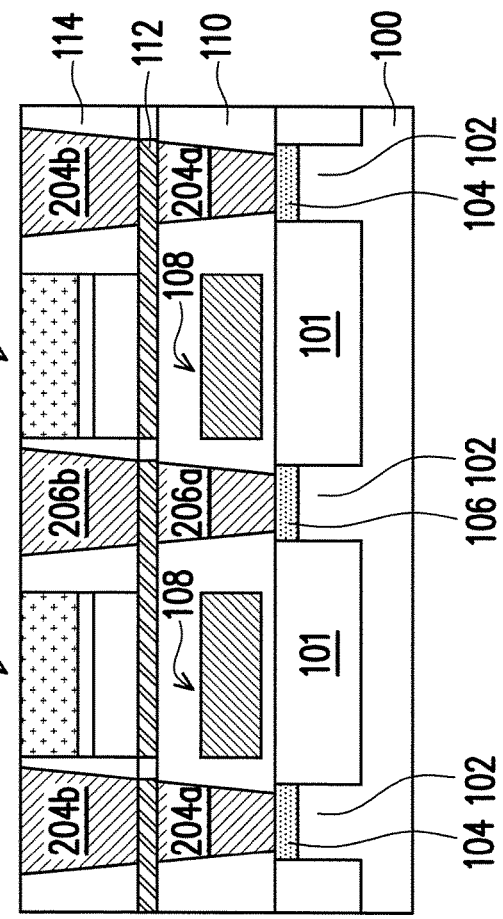

With reference to FIGS. 7A and 7B, a dielectric layer 114 is then formed aside the memory cells 210. Plugs 204b and 206b are formed in the dielectric layer 114. The plugs 204b are electrically connected to the plugs 204a through the lower electrodes 112. Similarly, the plugs 206b are electrically connected to the plugs 206a through the lower electrodes 112. In some embodiments, top surfaces of the dielectric layer 114 and the plugs 204b and 206b are substantially coplanar with top surfaces of the memory cells 210. Since materials and forming method of the dielectric layer 114 and the plugs 204b and 206b are respectively similar to the dielectric layer 110 and the plugs 204a and 206a, no further explanation is provided below.

With reference to FIGS. 8A and 8B, a plurality of metal layers 116 are then formed on the dielectric layer 114, the plugs 204b and 206b, and the memory cells 210. The metal layers 116 hereinafter are referred as upper electrodes 116. As shown in FIG. 8A, the lower electrodes 112 and the upper electrodes 116 are configured in a zigzag pattern in the top view. Specifically, the lower electrode 112 of one of the memory cells 210 is electrically connected to the upper electrode 116 of the adjacent memory cell 210. In other words, all of the memory cells 210 are connected in series by the plugs 204b and 206b.

In alternative embodiments, the memory cells 210 may be RRAMs. In the case, a variable resistance layer (not shown) is formed between the lower electrodes 112 and the upper electrodes 116. The lower electrodes 112 and the upper electrodes 116 may include titanium nitride (TiN), platinum (Pt), iridium (Ir), ruthenium (Ru), titanium (Ti), tungsten (W), tantalum (Ta), aluminum (Al), zirconium (Zr), hafnium (Hf), nickel (Ni), copper (Cu), cobalt (Co), iron (Fe), gadolinium (Y), manganese (Mo), or a combination thereof, and the lower electrodes 112 and the upper electrodes 116 may be formed through physical vapor deposition (PVD) or CVD, for instance. The variable resistance layer may include hafnium oxide (e.g., HfO or HfO$_2$), lanthanum oxide, gadolinium oxide, yttrium oxide, zirconium oxide, titanium oxide, tantalum oxide, nickel oxide, tungsten oxide, copper oxide, cobalt oxide, iron oxide, aluminum oxide, or a combination thereof, and the variable resistance layer may be formed through CVD, for instance.

Figure 9:
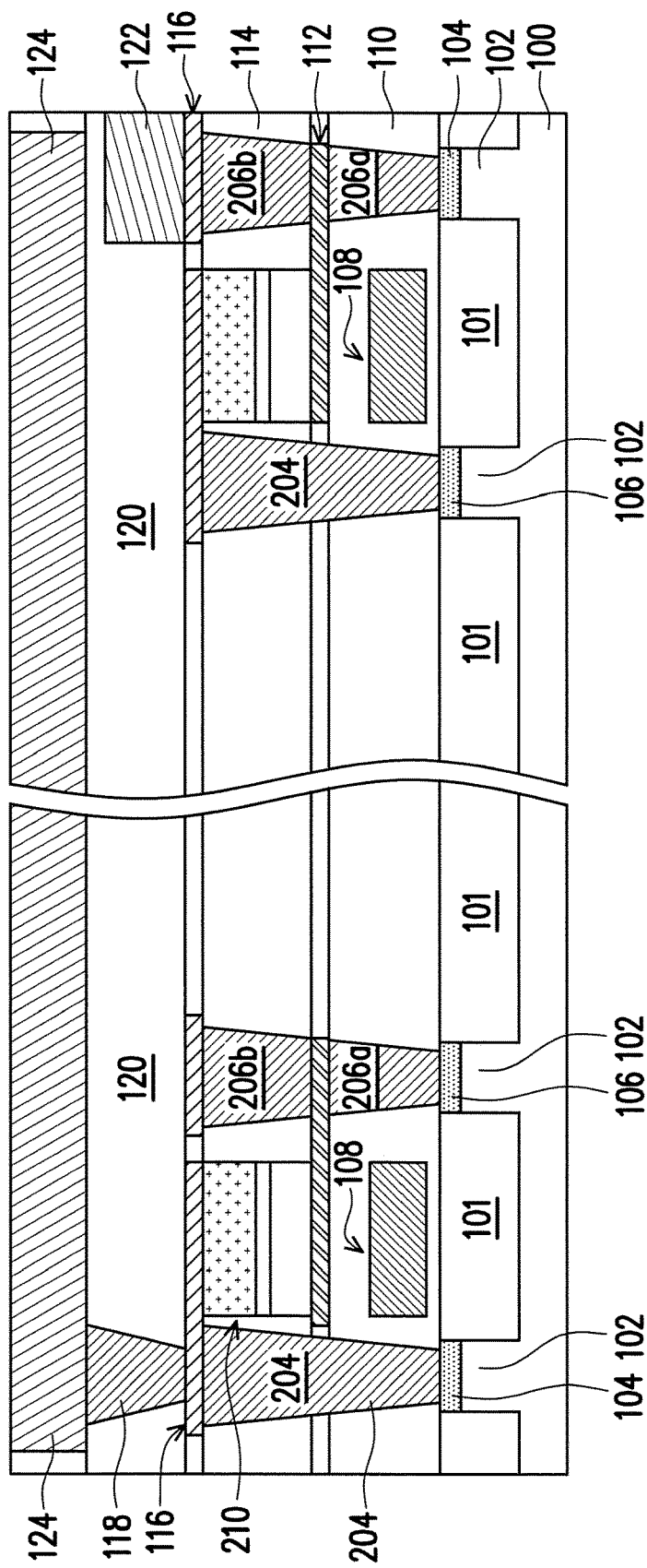
FIG. 9 is a schematic cross-sectional view of a semiconductor device in accordance with a third embodiment of the invention.

FIG. 9 is a schematic cross-sectional view of a semiconductor device in accordance with a third embodiment of the invention.

With reference to FIG. 9, after forming the upper electrodes 116, a dielectric layer 120 is formed on the upper electrodes 116. A plug 118 is then formed in the dielectric layer 120 and corresponding to one of the upper electrodes 116. The plug 118 is electrically connected to a corresponding S/D region 104 through the one of the upper electrodes 116 and plug 204. A source line 122 is formed in the dielectric layer 120 and corresponding to another of the upper electrodes 116. The source line 122 is electrically connected to a corresponding S/D region 106 through the another of the upper electrodes 116 and plugs 206a and 206b. A bit line 124 is then formed on the dielectric layer 120 and connected to the plug 118. As show in FIG. 9, extending directions of the bit line 124 and the source line 122 are substantially perpendicular to each other.

To sum up, the semiconductor device of the invention combines FinFETs and memory cells, such as MRAMs or RRAMs. Specifically, the memory cells are respectively located on the gate structures, such as word lines. A lower electrode of each of the memory cells and an upper electrode of an adjacent memory cell are electrically connected to the source/drain region between corresponding two transistors. In the case, the cell size of the invention will decrease to 4F$^2$ cell size, while the better endurance, reliability, and a smaller operating current are achieved compared with conventional memory.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:
1. A semiconductor device comprising:
   a plurality of transistors, each of the transistors comprising a gate structure and a source/drain region;
   a plurality of memory cells respectively located over the gate structures, wherein a lower electrode of each of the memory cells and an upper electrode of an adjacent memory cell are electrically connected to the source/drain region between corresponding two transistors; and
   a source line, coupled to one of the memory cells through a lower electrode of the one of the memory cells and a first plug, and coupled to a corresponding one of the transistors through the lower electrode of the one of the memory cells, the first plug and a second plug, wherein the lower electrode of the one of the memory cells is physically connected to and located between the first plug and the second plug.

2. The semiconductor device as recited in claim 1, wherein the source/drain region between the corresponding two transistors is a source of one of the corresponding two transistors and a drain of the other of the corresponding two transistors.

3. The semiconductor device as recited in claim 1, wherein the transistors comprise fin-type field effect transistors (FinFETs) or gate-all-around field effect transistors (GAA-FETs).

4. The semiconductor device as recited in claim 1, wherein the memory cells comprise magnetic random access memories (MRAMs), resistive random access memories (RRAMs), or a combination thereof.

5. The semiconductor device as recited in claim 1, wherein the memory cells are MRAMs, each of the MRAMs comprises a pinned layer, a free layer and a barrier layer therebetween, the pinned layer is connected to a corresponding lower electrode and the free layer is connected to a corresponding upper electrode.

6. The semiconductor device as recited in claim 1, the memory cells are RRAMs, each of the RRAMs comprises a variable resistance layer between a corresponding lower electrode and a corresponding upper electrode.

7. The semiconductor device as recited in claim 1, further comprising a bit line coupled to another of the transistors and corresponding another of the memory cells, wherein an extending direction of the bit line differs from an extending direction of the source line.

8. The semiconductor device as recited in claim 1, wherein the upper electrode of each of the memory cells is electrically connected to the lower electrode of an adjacent memory cell by a plug, except for the memory cell whose upper electrode is connected to an overlying bit line.

9. A semiconductor device comprising:
a plurality of semiconductor layers located on a substrate;
a plurality of isolation structures located over the substrate to isolate the semiconductor layers, wherein the semiconductor layers protrude from the isolation structures;
a plurality of gate structures respectively across at least portions of the semiconductor layers and portions of the isolation structures;
a plurality of memory cells respectively located over the gate structures between adjacent two semiconductor layers, wherein each of the memory cells comprises a lower electrode and an upper electrode, the lower electrode of each of the memory cells is electrically connected to the upper electrode of an adjacent memory cell; and
a source line, coupled to one of the memory cells through a lower electrode of the one of the memory cells and a first plug, and coupled to a corresponding one of the transistors through the lower electrode of the one of the memory cells, the first plug and a second plug, wherein the lower electrode of the one of the memory cells is physically connected to and located between the first plug and the second plug.

10. The semiconductor device as recited in claim 9, wherein the lower electrode of each of the memory cells and the upper electrode of the adjacent memory cell are electrically connected to one semiconductor layer.

11. The semiconductor device as recited in claim 9, wherein the memory cells comprise MRAMs, RRAMs, or a combination thereof.

12. The semiconductor device as recited in claim 9, wherein the memory cells are MRAMs, each of the MRAMs comprises a pinned layer, a free layer and a barrier layer therebetween, the pinned layer is connected to a corresponding lower electrode and the free layer is connected to a corresponding upper electrode.

13. The semiconductor device as recited in claim 9, the memory cells are RRAMs, each of the RRAMs comprises a variable resistance layer between a corresponding lower electrode and a corresponding upper electrode.

14. The semiconductor device as recited in claim 9, further comprising a bit line coupled to another of the memory cells and corresponding another of the semiconductor layers, wherein an extending direction of the bit line differs from an extending direction of the source line.

15. The semiconductor device as recited in claim 9, wherein the semiconductor layers comprise semiconductor fins extending along a first direction and the semiconductor fins and the isolation structures are arranged alternately along a second direction.

16. The semiconductor device as recited in claim 9, wherein the semiconductor layers comprise nanowire stacks extending along a first direction and the nanowire stacks and the isolation structures are arranged alternately along a second direction.

17. The semiconductor device as recited in claim 16, wherein the nanowire stacks are encapsulated by the gate structures extending along the second direction.

18. The semiconductor device as recited in claim 16, wherein each of the nanowire stacks comprises a plurality of nanowires stacked along a direction perpendicular to a top surface of the substrate.

19. The semiconductor device as recited in claim 18, wherein a linewidth of each of the nanowires is in a range of 5 nm to 50 nm.

20. The semiconductor device as recited in claim 18, wherein a pitch of adjacent two nanowires is in a range of 5 nm to 20 nm.

* * * * *